(12) United States Patent
Gong et al.

(10) Patent No.: US 11,301,068 B2
(45) Date of Patent: Apr. 12, 2022

(54) DISPLAY PANEL, DISPLAY ASSEMBLY AND MANUFACTURING METHOD THEREOF, AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Wei Gong, Beijing (CN); Jianbiao Ding, Beijing (CN); Haiwei Sun, Beijing (CN); Jian Sang, Beijing (CN); Shipeng Wang, Beijing (CN); Jeonyeong Ho, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 342 days.

(21) Appl. No.: 16/614,169

(22) PCT Filed: Apr. 30, 2019

(86) PCT No.: PCT/CN2019/085222
§ 371 (c)(1),
(2) Date: Nov. 15, 2019

(87) PCT Pub. No.: WO2020/001157
PCT Pub. Date: Jan. 2, 2020

(65) Prior Publication Data
US 2021/0360174 A1    Nov. 18, 2021

(30) Foreign Application Priority Data
Jun. 29, 2018    (CN) .......................... 201810713370.8

(51) Int. Cl.
*G06F 3/041* (2006.01)
*H01L 27/146* (2006.01)
*H04N 5/33* (2006.01)

(52) U.S. Cl.
CPC ...... *G06F 3/0412* (2013.01); *H01L 27/14634* (2013.01); *H01L 27/14649* (2013.01); *H01L 27/14683* (2013.01); *H04N 5/33* (2013.01)

(58) Field of Classification Search
CPC ............... H04N 5/33; H01L 27/14634; H01L 27/14649; H01L 27/14683; G09F 9/00
See application file for complete search history.

(56) References Cited

U.S. PATENT DOCUMENTS 10,115,664 B2 * 10/2018 Lai ........................ H05K 3/323
10,705,664 B2 *  7/2020 Wang .................... G06F 3/0416
(Continued)

FOREIGN PATENT DOCUMENTS

CN         1922470 A    2/2007
CN       201935335 U    8/2011
(Continued)

OTHER PUBLICATIONS

First Office Action dated May 21, 2019, for corresponding Chinese application 201810713370.8.

*Primary Examiner* — Tony Ko
(74) *Attorney, Agent, or Firm* — Nath, Goldberg & Meyer; Joshua B. Goldberg

(57) ABSTRACT

A display panel, a display assembly and a manufacturing method thereof, and a display device are provided. The display panel includes a first substrate and a second substrate, a length of the second substrate is greater than that of the first substrate in at least one direction, a portion of the second substrate beyond the first substrate in a case that the first substrate and the second substrate are assembled into a cell forms a monolayer region, and a signal receiver is (Continued)

A-A disposed on the monolayer region for receiving a detection signal from external environment. The display assembly includes the display panel. The display device includes the display assembly.

20 Claims, 4 Drawing Sheets

(56) References Cited

U.S. PATENT DOCUMENTS

| | | | |
|---|---|---|---|
| 2008/0192013 A1* | 8/2008 | Barrus | G06F 3/04164 |
| | | | 345/173 |
| 2019/0189644 A1 | 6/2019 | Wang et al. | |
| 2019/0285922 A1 | 9/2019 | Sun et al. | |

FOREIGN PATENT DOCUMENTS

| | | | |
|---|---|---|---|
| CN | 103439819 A | 12/2013 | |
| CN | 103906357 A | 7/2014 | |
| CN | 104600150 A | 5/2015 | |
| CN | 205193392 U | 4/2016 | |
| CN | 107167947 A | 9/2017 | |
| CN | 107247373 A | 10/2017 | |
| CN | 107728362 A | 2/2018 | |
| CN | 107831834 A | 3/2018 | |
| CN | 108008861 A | 5/2018 | |
| CN | 108388056 A | 8/2018 | |
| CN | 108831291 A | 11/2018 | |

* cited by examiner

A-A

B-B

C-C

DISPLAY PANEL, DISPLAY ASSEMBLY AND MANUFACTURING METHOD THEREOF, AND DISPLAY DEVICE

CROSS-REFERENCE TO RELATED APPLICATION

This is a National Phase Application filed under 35 U.S.C. 371 as a national stage of PCT/CN2019/085222, filed Apr. 30, 2019, an application claiming the benefit of Chinese Application No. 201810713370.8, filed Jun. 29, 2018, the content of each of which is hereby incorporated by reference in its entirety.

TECHNICAL FIELD

The present disclosure relates to the field of display technology, and more particularly, to a display panel, a display assembly, a method for manufacturing a display assembly, and a display device.

BACKGROUND

A display device (e.g., a mobile phone, a tablet computer, etc.) is generally provided with a plurality of sensors (e.g., a pressure sensor, a proximity sensor, a light sensor, a temperature sensor, a magnetic sensor, etc.) to realize various functions of the display device.

SUMMARY

According to embodiments of present disclosure, a display panel is provided, the display panel includes a first substrate and a second substrate, and a length of the second substrate is greater than that of the first substrate in at least one direction, a portion of the second substrate beyond the first substrate in a case that the first substrate and the second substrate are assembled into a cell forms a monolayer region, and a signal receiver is disposed on the monolayer region for receiving a detection signal from external environment.

In some embodiments, a signal emitter is further disposed on the monolayer region for emitting a signal to the external environment, and the signal emitter and the signal receiver are disposed to form an angle therebetween.

In some embodiments, the signal emitter is an infrared light emitter and includes an emitter driving circuit arranged on the monolayer region and an infrared light emitting diode disposed on and electrically connected with the emitter driving circuit, an output terminal of the emitter driving circuit is provided with a first bonding electrode, and a light emitting surface of the infrared light emitting diode is provided with a collimating lens thereon.

In some embodiments, the signal receiver is an infrared light sensor and includes a sensor driving circuit disposed on the monolayer region and an infrared light sensing component disposed on and electrically connected with the sensor driving circuit, and an output terminal of the sensor driving circuit is provided with a second bonding electrode.

In some embodiments, the infrared light emitting diode has a thickness of 0.2 mm to 0.5 mm, and the collimating lens has a thickness of 0.2 mm to 0.5 mm.

In some embodiments, the signal emitter and the signal receiver are separated from each other by a certain distance.

According to embodiments of the present disclosure, a display assembly including the display panel as described above is provided, and the display assembly further includes: a flexible circuit board bonded to a side of the monolayer region of the display panel; and a signal processor disposed on the flexible circuit board, the signal receiver is electrically connected with the signal processor through the flexible circuit board, and the signal processor is configured to process the detection signal received by the signal receiver.

In some embodiments, a signal emitter is further provided on the monolayer region for emitting a signal to the external environment, and the signal emitter and the signal receiver are disposed to form an angle therebetween, and the signal emitter is electrically connected with the signal processor through the flexible circuit board.

In some embodiments, the signal emitter includes a first bonding electrode, the signal receiver includes a second bonding electrode, and the first bonding electrode and the second bonding electrode are respectively bonded to the flexible circuit board.

In some embodiments, a connection line connecting the signal emitter, the signal receiver and the signal processor has a triangle shape.

According to embodiments of the present disclosure, a display device including the display assembly as describe above is provided.

In some embodiments, the display device of further includes a cover plate disposed on a side of the display panel, and a side of the cover plate proximal to the monolayer region is provided with a groove for receiving the signal receiver.

In some embodiments, a signal emitter is further disposed on the monolayer region of the display panel for emitting a signal to the external environment, the signal emitter and the signal receiver are disposed to form an angle therebetween, and a groove is further disposed on the side of the cover plate proximal to the monolayer region for receiving the signal emitter.

In some embodiments, a collimating lens is disposed on the signal emitter, a distance between the collimating lens and a concave surface of the groove for receiving the signal emitter is 0 mm to 0.064 mm, and a thickness of a portion of the cover plate where the groove for receiving the signal emitter is located is 0.3 mm to 0.7 mm.

According to embodiments of the present disclosure, a method for manufacturing a display assembly is provided, including: providing a display panel, the display panel including a first substrate and a second substrate, a length of the second substrate is greater than that of the first substrate in at least one direction, a portion of the second substrate beyond the first substrate after the first substrate and the second substrate are assembled into a cell forms a monolayer region, and a bonding electrode is disposed on the monolayer region; disposing a signal receiver on the monolayer region and electrically connecting the signal receiver to the bonding electrode; disposing a signal processor on a flexible circuit board; and electrically connecting the flexible circuit board disposed with the signal processor to the bonding electrode.

In some embodiments, the method for manufacturing a display assembly further includes: disposing a signal emitter on the monolayer region, the signal receiver is an infrared light sensor, the signal emitter is an infrared light emitter; and the disposing the signal emitter on the monolayer region includes disposing an emitter drive circuit on the monolayer region and disposing an infrared light emitting diode on the emitter drive circuit.

In some embodiments, the disposing the infrared light emitting diode on the emitter driving circuit includes: dispensing silver paste on the emitter driving circuit; curing the silver paste; placing the infrared light emitting diode on the silver paste, and welding tin around the infrared light emitting diode; and coating an ultraviolet light curable adhesive around the infrared light emitting diode to cover a tin layer.

In some embodiments, the curing the silver paste includes curing the silver paste by laser.

BRIEF DESCRIPTION OF THE FIGURES

In order to more clearly illustrate technical solutions of embodiments of the present disclosure or the related art, drawings for illustrating the embodiments of the present disclosure or the related art will be briefly described below. It is obvious that the drawings only show some embodiments of the present disclosure, and based on the drawings, other drawings can be obtained by one of ordinary skill in the art without inventive effort. Moreover, the drawings are for illustrative purposes only instead of showing actual sizes of components, and therefore may not be drawn to scale.

DETAILED DESCRIPTION

The technical solutions of the embodiments of the present disclosure will be clearly and fully described below with reference to the drawings of the embodiments of the present disclosure. It is apparent that the described embodiments are only a part of embodiments of the present disclosure, but not all of the embodiments. All the other embodiments, which can be obtained by one of ordinary skill in the art without any inventive effort based on the embodiments disclosed herein, fall within the scope of the present disclosure.

Generally, in a display device, a display panel and a sensor are separated from each other, and the sensor and connecting circuits thereof occupy a large space. Taking a case where a display panel and a proximity sensor of the display device are separated from each other as an example, the proximity sensor may be connected with a main board of the display panel through a separate flexible circuit board, and the proximity sensor and the connecting circuits thereof may occupy a large space, which is disadvantageous to reducing the size of the whole display device.

Figure 1:
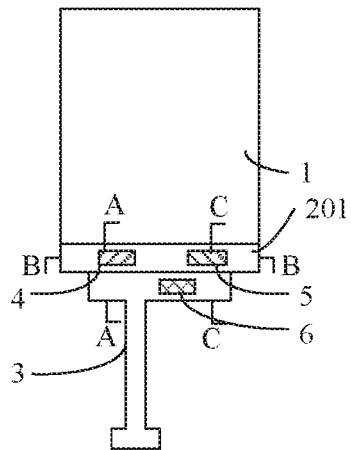
FIG. 1 is a schematic structural diagram of a display assembly according to some embodiments of the present disclosure.
Figure 2:
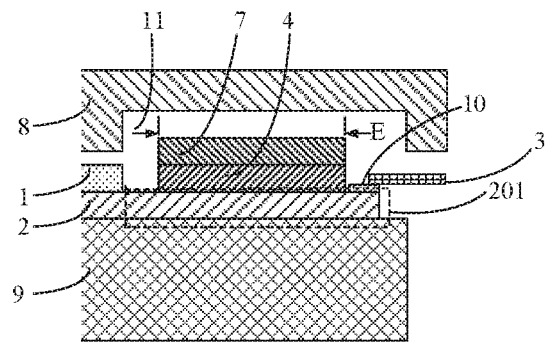
FIG. 2 is a cross-sectional view of the monolayer region taken along line A-A of FIG. 1.
Figure 3:
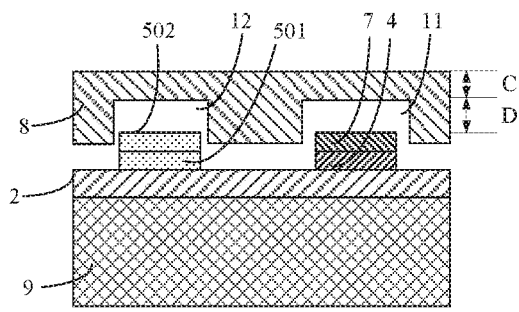
FIG. 3 is a cross-sectional view of the monolayer region taken along line B-B of FIG. 1.
Figure 4:
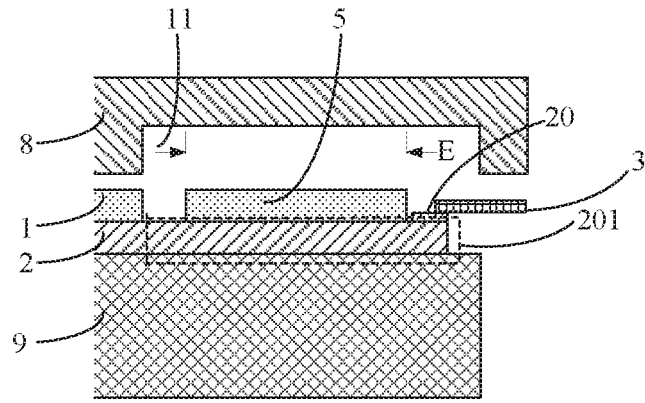
FIG. 4 is a cross-sectional view of the monolayer region taken along line C-C of FIG. 1.

FIG. 1 is a schematic structural diagram of a display assembly according to some embodiments of the present disclosure. FIG. 2 is a cross-sectional view of the monolayer region taken along line A-A of FIG. 1. FIG. 3 is a cross-sectional view of the monolayer region taken along line B-B of FIG. 1. FIG. 4 is a cross-sectional view of the monolayer region taken along line C-C of FIG. 1.

As shown in FIGS. 1 to 4, a display assembly provided by embodiments of the present disclosure includes a display panel including a first substrate 1 and a second substrate 2, and a length of the second substrate 2 is greater than that of the first substrate 1 in at least one direction. A portion of the second substrate 2 beyond the first substrate 1 in a case that the first substrate 1 and the second substrate 2 are assembled into a cell forms a monolayer region 201.

In some embodiments, the first substrate 1 may be an array substrate, and the second substrate 2 may be a color filter substrate. The array substrate may include a thin film transistor and the like, and the color filter substrate may include a black matrix, a color filter and the like. In this case, in at least one direction, a length of the color filter substrate is greater than that of the array substrate, and a portion of the color filter substrate beyond the array substrate in a case that the array substrate and the color filter substrate are assembled into a cell forms the monolayer region 201. A flexible circuit board 3 may be bonded on the monolayer region 201 for supplying a driving signal to the display panel. As an example, FIG. 1 shows a top view of a display assembly according to an embodiment of the present disclosure. In this example, as shown in FIG. 1, the first substrate 1 covers a portion of the second substrate 2, and a portion of the second substrate 2 beyond the first substrate 1 is the monolayer region 201. In the embodiment of the present disclosure, a core component of a sensor is integrated on the monolayer region 201. That is, the monolayer region 201 is provided with a signal receiver 5, and the signal receiver 5 is configured to receive a detection signal from the external environment.

In the display assembly provided by the embodiment of the present disclosure, the core component (i.e., the signal receiver 5) of the sensor is integrated on the monolayer region 201 of the display panel, so that a space occupancy rate of the sensor in the display device is reduced, and flexible wirings and connectors required for disposing the sensor in the display device are reduced. Thus, an internal space of the display device is saved, and the complexity of an internal structure of the display device is reduced.

In some embodiments, the monolayer region 201 may further be provided with a signal emitter 4 for emitting a signal to the external environment. That is, as for a sensor having the signal emitter 4, the signal emitter 4 of the sensor can be further integrated on the monolayer region 201 of the display panel, so that the flexible wirings and the connectors required for disposing the sensor in the display device are further reduced, which is beneficial to reducing the space occupancy rate of the sensor in the display device.

The sensor according to the embodiments of the present disclosure may be sensors that may emit and receive signals, such as a proximity sensor, a light sensor and the like. Correspondingly, the signal emitter 4 may be an infrared light emitter, a light projector and the like, and the signal receiver 5 may be an infrared light sensor, a light receiver and the like.

The sensor according to the embodiments of the present disclosure may also be a sensor that may realize corresponding functions only by using a detection signal received from the external environment without emitting a signal, such as a pressure sensor, a temperature sensor, a magnetic sensor and the like, and the corresponding signal receiver 5 may be a pressure sensing capacitor, a temperature sensor, a magnetic signal receiver and the like.

In general, the proximity sensor (P-Sensor) includes an optical proximity sensor, an infrared proximity sensor, an ultrasonic proximity sensor and the like. As for the infrared proximity sensor, the infrared proximity sensor has an infrared light emitter and an infrared light sensor. The infrared light emitter and the infrared light sensor may be disposed to form an angle therebetween, the infrared light emitter emits infrared rays, and the infrared light sensor receives infrared rays reflected by an object (e.g., a human face) in an external environment. When the infrared ray emitted by the infrared light emitter of the infrared proximity sensor integrated in the display device (e.g., a mobile phone) reflected by the object in the external environment and then received by the infrared light sensor, it indicates that the object in the external environment is close to the display device (e.g., close to a screen of the display device), and the screen of the display device can be locked so as to avoid a misoperation. When the infrared ray emitted by the infrared light emitter of the infrared proximity sensor integrated in the display device is reflected by the object in the external environment and then is not received by the infrared light sensor, it indicates that the object in the external environment is far away from the display device (e.g., far away from the screen of the display device), and the screen of the display device can be unlocked. As an example, when a user makes or receives a call using a mobile phone, if the user's face is too close to the screen of the mobile phone, the screen of the mobile phone may be locked to avoid a misoperation, and if the user's face is far enough away from the mobile phone screen, the screen of the mobile phone may be unlocked.

The proximity sensor may also determine a distance between itself and an object in the external environment by emitting ultrasonic waves, light pulses and the like and receiving the ultrasonic waves, light pulses and the like reflected by the object in the external environment. A specific structure of the display panel of the embodiment of the present disclosure will be described in detail below by taking an infrared proximity sensor as an example.

Referring to FIGS. 2 to 4 and FIGS. 6(a) to 6(d), in some embodiments, the signal emitter 4 is an infrared light emitter for emitting infrared rays to an external environment. The signal emitter 4 may include an emitter driving circuit 401 arranged on the monolayer region 201, and an output terminal of the emitter driving circuit 401 is provided with a first bonding electrode 10. The signal emitter 4 further includes an infrared light emitting diode 402 mounted on and electrically connected with the emitter driving circuit 401. A collimating lens 7 is disposed on the light emitting surface of the infrared light emitting diode 402, and may converge infrared rays. The type and model of the infrared light emitting diode 402 and the collimating lens 7 can be selected according to actual needs. For example, an infrared light emitting diode 402 having a model of CSP1313 can be used to emit infrared light, and the infrared light emitting diode 402 having the model of CSP1313 has dimensions of 1.3 mm×1.3 mm×0.32 mm (length×width×height) and a forward current value of 700 mA. For example, an infrared light emitting diode 402 having a model of CSP1515 may also be used to emit infrared light, and the infrared light emitting diode 402 having the model of CSP1515 has dimensions of 1.57 mm×1.57 mm×0.3 mm (length×width× height) and a forward current value of 700 mA. As an example, the infrared light emitting diode 402 having the model of CSP1515 may be selected, which has a small thickness (height) and a light efficiency satisfying a usage requirement. The collimating lens 7 may be, for example, a Fresnel lens, and more realistic optical phenomena can be obtained by using the Fresnel lens. In some embodiments, a thickness of the infrared light emitting diode 402 may be 0.2 mm to 0.5 mm and a thickness of the collimating lens 7 may be 0.2 mm to 0.5 mm, depending on the size of the space on the monolayer region 201. The size of the infrared light emitting diode 402 may be the same as or different from the size of the collimating lens 7.

In some embodiments, the signal receiver 5 is an infrared light sensor for receiving infrared light reflected by an object in the external environment. The signal receiver 5 may include a sensor driving circuit 501 and an infrared light sensing component 502. The sensor driving circuit 501 may be arranged on the monolayer region 201, an output terminal of the sensor driving circuit 501 may be provided with a second bonding electrode 20, and the infrared light sensing component 502 may be mounted on and electrically connected with the sensor driving circuit 501, for converting the received infrared rays into electrical signals, and transmitting the electrical signals to a signal processor 6 (as shown in FIG. 1).

In some embodiments, the signal emitter 4 and the signal receiver 5 maybe separated from each other by a certain distance to provide space for a bonding electrode and other components and connectors.

The display assembly provided by an embodiment of the present disclosure may further include the flexible circuit board 3 and the signal processor 6. As shown in FIGS. 1 and 2, the flexible circuit board 3 is bonded to a side of the monolayer region 201 of the display panel, the signal processor 6 is mounted on the flexible circuit board 3, the signal receiver 5 is electrically connected with the signal processor 6 through the flexible circuit board 3, and the signal processor 6 is configured to process a detection signal received by the signal receiver 5.

In the display assembly provided by an embodiment of the present disclosure, the core component (i.e., the signal receiver 5) of the sensor is integrated on the monolayer region 201 of the display panel, and the signal processor 6 is integrated on the flexible circuit board 3, so that the signal transmission between the signal receiver 5 and the signal processor 6 and the processing of the detection signal received by the signal receiver 5 are realized through the bonding between the monolayer region 201 and the flexible circuit board 3, the occupation of space by separately disposing the sensor and the flexible wirings is avoided, and the internal space of the display device is saved.

For the case of further integrating the signal emitter 4 of the sensor on the monolayer region 201 of the display panel, the signal emitter 4 is also electrically connected with the signal processor 6 through the flexible circuit board 3, so as to further reduce the occupation of space by the flexible wirings and the connectors, thereby further saving the internal space of the display device.

In some embodiments, the signal emitter 4 includes the first bonding electrode 10, and the signal receiver 5 includes the second bonding electrode 20. The first bonding electrode 10 and the second bonding electrode 20 are respectively bonded to the flexible circuit board 3 to transfer signals, which reduces the arrangement of flexible wirings.

In some embodiments, the signal emitter 4 and the signal receiver 5 are separated from each other by a certain distance, and the signal processor 6 is located on the flexible circuit board 3, so that a connection line connecting the signal emitter 4, the signal receiver 5 and the signal processor 6 has a triangle shape. Moreover, the positions of all the components can be arranged more reasonably, and the space on the monolayer region 201 is fully utilized to further improve a space utilization rate of the display assembly.

In some embodiments, the signal processor 6 may be connected to the flexible circuit board 3 as a separate component or may be integrated with other components on the flexible circuit board 3.

The embodiment of the present disclosure also provides a display device, which includes the display assembly as described above.

As shown in FIG. 2, the display device of the embodiment of the present disclosure may further include a cover plate 8 disposed on a side of the display panel, and a gap is formed between the cover plate 8 and the monolayer region 201. In order to dispose the collimating lens 7 and the signal emitter 4 in the gap, a first groove 11 may be disposed on a side of the cover plate 8 proximal to the monolayer region 201. The signal emitter 4 (e.g., an infrared proximity sensor) is disposed in the first groove 11, and a light emitting surface of the infrared light emitting diode 402 of the signal emitter 4 is proximal to the cover plate 8.

The other side of the display panel may be provided with a backlight assembly 9 for providing backlight to the display panel. It should be noted that FIG. 2 only shows a specific structure related to the monolayer region 201 of the display device, and only schematically shows the backlight assembly. For example, the backlight assembly may include a backlight source, a light guide plate, a support frame, and the like.

In some embodiments, as shown in FIG. 3, a distance D between the collimating lens 7 and the concave surface of the first groove 11 may be 0 mm to 0.064 mm, and a thickness C of a portion of the cover plate 8 where the first groove 11 is located may be 0.3 mm to 0.7 mm.

In some embodiments, the side of the cover plate 8 proximal to the monolayer region 201 may further be provided with a second groove 12, the signal receiver 5 may be disposed in the second groove 12, and a light receiving surface of the infrared light sensing component 502 of the signal receiver 5 is proximal to the cover plate 8 so as to receive the infrared light reflected by the object in the external environment.

As shown in FIG. 2, in the display assembly, both a width of the signal emitter 4 and a width of the collimating lens 7 may be denoted by the reference sign "E" which is 0.3 mm to 0.7 mm.

The first groove 11 and the second groove 12 may be formed by laser or etching. For a display assembly having only the signal receiver 5 (i.e. only a function of a pressure sensor or the like may be realized), the cover plate 8 may be provided with only the second groove 12. For a display assembly having the signal emitter 4 and the signal receiver 5, the cover plate 8 may be provided with both the first groove 11 and the second groove 12.

The display device provided by the embodiments of the present disclosure may be a liquid crystal panel, electronic paper, an Organic Light-Emitting Diode (OLED) panel, or any product or component with a display function that can be applied to a mobile phone, a tablet computer, a television, a display, a notebook computer, a digital photo frame, a navigator, and the like.

Figure 5:
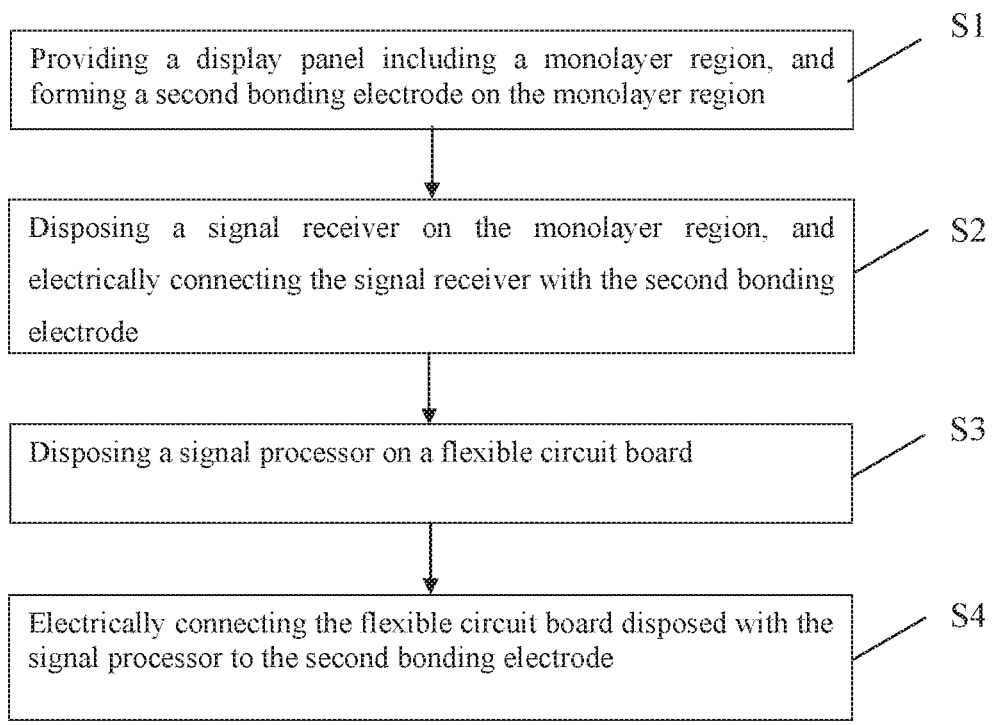
FIGS. 5(a) to 5(c) are flowcharts illustrating a method for manufacturing a display assembly according to some embodiments of the present disclosure.
Figure 5:
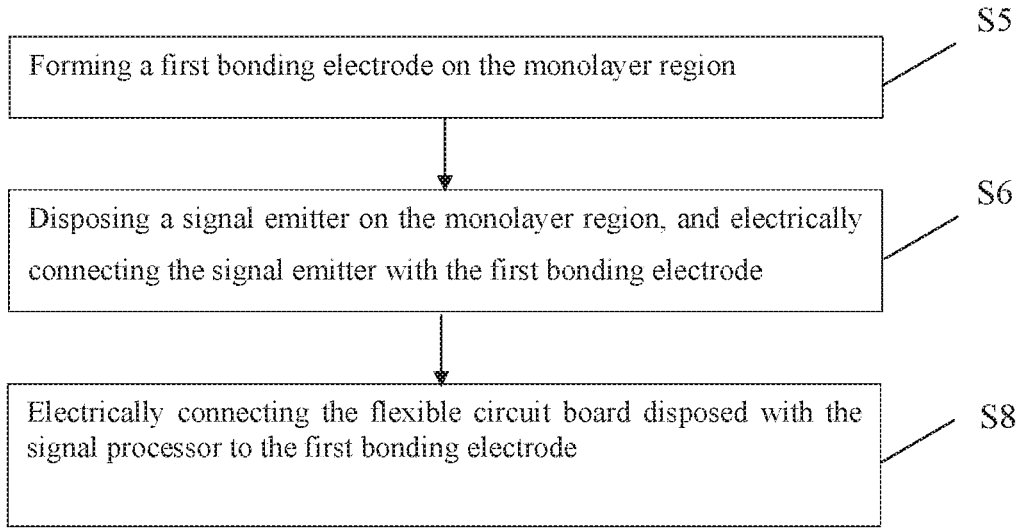
Figure 5:
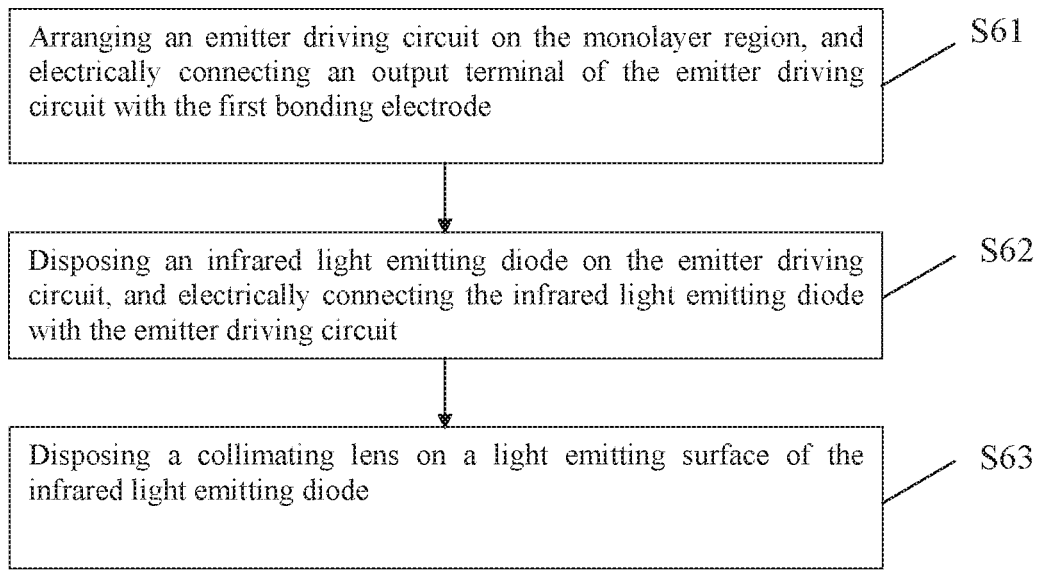

FIGS. 5(a) to 5(c) are flowcharts illustrating a method for manufacturing a display assembly according to some embodiments of the present disclosure. Referring to FIG. 5(a), an embodiment of the present disclosure provides a method for manufacturing a display assembly, including the following steps S1 to S4.

In step S1, a display panel is provided, wherein the display panel includes a first substrate 1 and a second substrate 2, a length of the second substrate 2 is greater than that of the first substrate 1 in at least one direction, a portion of the second substrate 2 beyond the first substrate 1 after the first substrate 1 and the second substrate 2 are assembled into a cell is a monolayer region 201, and a second bonding electrode 20 is formed on the monolayer region 201.

In step S2, a signal receiver 5 is disposed on the monolayer region 201, and the signal receiver 5 is electrically connected with the second bonding electrode 20.

In step S3, a signal processor 6 is disposed on a flexible circuit board 3.

In step S4, the flexible circuit board 3 disposed with the signal processor 6 is electrically connected with the second bonding electrode 20.

In some embodiments, referring to FIG. 5(b), the method for manufacturing a display assembly according to the embodiments of the present disclosure further includes the following steps S5 to S7.

In step S5, a first bonding electrode 10 is formed on the monolayer region 201.

In step S6, a signal emitter 4 is disposed on the monolayer region 201, and the signal emitter 4 is electrically connected with the first bonding electrode 10.

In step S7, the flexible circuit board 3 disposed with the signal processor 6 is electrically connected to the first bonding electrode 10.

The signal emitter 4 may be, for example, an infrared light emitter. In some embodiments, referring to FIG. 5(c), the step of disposing the signal emitter 4 on the monolayer region 201 includes the following steps S61 to S63.

In step S61, an emitter driving circuit 401 is arranged on the monolayer region 201, and an output terminal of the emitter driving circuit 401 is electrically connected with the first bonding electrode 10.

In step S62, an infrared light emitting diode 402 is disposed on the emitter driving circuit 401, and the infrared light emitting diode 402 is electrically connected with the emitter driving circuit 401.

In step S63, a collimating lens 7 is disposed on a light emitting surface of the infrared light emitting diode 402.

The process of disposing the infrared light emitting diode 402 on the emitter driving circuit 401 may include a welding process. The solder used in the welding process mainly includes materials such as solder balls, solder paste, silver paste and the like, and the welding method adopted can be laser spot welding or reflow soldering. To obtain a welding process suitable for the embodiments of the present disclosure, the following tests as shown in table 1 below were performed:

TABLE 1

| Test number | Solder | Welding temperature (° C.) | Welding method |
|---|---|---|---|
| 1 | tin paste | 200 to 230 | Reflow soldering |
| 2 | Silver paste | 80 to 150 | Reflow soldering |
| 3 | tin ball | 200 to 230 | Laser spot welding |
| 4 | Silver paste | 80 to 150 | Laser spot welding |

In general, a heat-resistant temperature of devices within an infrared light-emitting diode is about 85° C., and a heat-resistant temperature of devices within the flexible circuit board 3 may reach 280° C. to 400° C. As can be seen from the test results in table 1, the soldering temperature is high when the reflow soldering is employed in combination with the tin paste, and the devices within the infrared light emitting diode 402 may be damaged. When the reflow soldering is employed in combination with the silver paste, problems that a firmness of the weldment is poor and a drawing force test cannot be passed may occur and the reliability of the weldment is low. When the laser spot welding is employed in combination with the tin ball, a local high-temperature welding has no influence on devices within the infrared light emitting diode 402, but if an electrode of a welded piece is an ITO/Ag/ITO (i.e., a laminated structure formed by sequentially laminating an indium tin oxide layer, a silver layer and an indium tin oxide layer) electrode, there will have problems that the welded piece being unable to stick to tin, so that types of the electrode of the welded piece need to be selected. When the laser spot welding is employed in combination with the silver paste, the devices within the infrared light emitting diode 402 may not be damaged by the welding temperature, and the weldment is firmly fixed and the welded piece is not easy to fall off. Thus, in some embodiments, a process of the laser spot welding in combination with the silver paste may be employed.

With respect to selecting the types of the electrode of the welded piece, welding of tin on the electrodes with the surfaces respectively made of an ITO/Ag/ITO material and a Cu/Au (i.e., a laminated structure formed by sequentially laminating a copper layer and a gold layer) material is tested, and the result shows that as for the electrode with the surface made of the ITO/Ag/ITO material, the surface of the electrode can hardly stick to tin, and tin balls may be directly bounced off the electrode in an ejection welding process, so that laser is applied to the surface of the product, thus the electrode may be damaged; and if the laser energy, the ejection pressure and the ejection height are reduced, the tin balls can be sticked to the surface of the electrode, but the electrode is easy to fall off, and thus a resistance welding cannot be performed. However, as for the electrode with the surface made of the Cu/Au material, the welding effect is good, and the electrode is not easy to fall off. Thus, in some embodiments, the welding may be performed by using the electrode with its surface made of the Cu/Au material.

Figure 6:
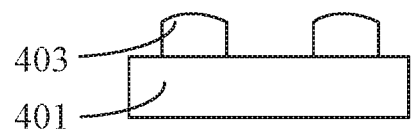
FIGS. 6(a) to 6(d) are schematic diagrams illustrating installation of an infrared light emitting diode on an emitter driving circuit in the method for manufacturing the display assembly according to some embodiments of the present disclosure.
Figure 6:
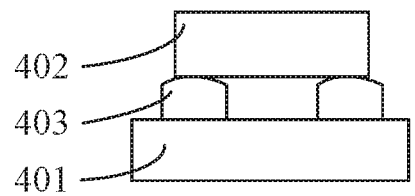
Figure 6:
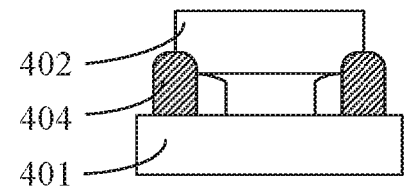
Figure 6:
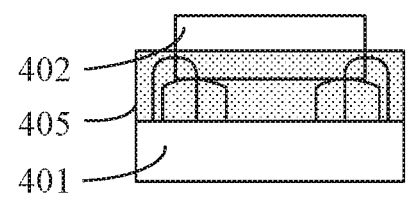

FIGS. 6(a) to 6(d) are schematic flowcharts illustrating installation of an infrared light emitting diode on an emitter driving circuit in the method for manufacturing the display assembly according to some embodiments of the present disclosure. FIG. 6(a) shows a process of dispensing silver paste on the emitter driving circuit. FIG. 6(b) shows a process of providing the infrared light emitting diode on the silver paste. FIG. 6(c) shows a process of welding tin around the infrared light emitting diode. FIG. 6(d) shows a process of applying ultraviolet (UV) curable adhesive around the infrared light emitting diode. As shown in FIGS. 6(a) to 6(d), the step of disposing the infrared light emitting diode 402 on the emitter driving circuit 401 by using the laser spot welding in combination with the silver paste includes the following steps: as shown in FIG. 6(a), dispensing a silver paste 403 on the emitter driving circuit 401, and curing the silver paste 403; as shown in FIGS. 6(b) and 6(c), providing the infrared light emitting diode 402 on the silver paste 403, and welding the tin 404 around the infrared light emitting diode 402; as shown in FIG. 6(d), applying a UV curable adhesive 405 around the infrared light emitting diode to cover the tin layer. In some embodiments, a silver paste dispenser from Naxin company or Xierde company may be used to dispense the silver paste 403 on the emitter driver circuit 401, afterwards, curing the silver paste 403 by using a laser such as an infrared laser that emits infrared light with the wavelength of 1064 nm and has the power of 20 W; and after the silver paste 403 is cured, providing the infrared light emitting diode 402 on the silver paste 403 by using an insertion machine; then, welding the tin 404 around the infrared light emitting diode 402 by using a laser spot welding machine, wherein a diameter of a tin ball may be 0.3 mm, 0.6 mm, and the like; finally, coating, by using a coating machine, the UV curable adhesive 405 around the infrared light emitting diode 402 to cover the tin layer, so as to cover the silver paste 403 and the tin layer to protect the conductive metal.

The embodiment of the present disclosure also provides a method for manufacturing the display device, and his method includes the method for providing the display assembly of the embodiment of the present disclosure.

In some embodiments, referring to FIGS. 1 to 4, the method for manufacturing a display device according to the embodiment of the present disclosure further includes: providing a cover plate 8, and slotting (i.e., making a slot) at a set position on the cover plate 8 to form a second groove 12; disposing the cover plate 8 on a side of the display assembly so as to form a gap between the cover plate 8 and the monolayer region 201, an opening of the second groove 12 being proximal to a surface of the monolayer region 201, and the signal receiver 5 being located in the second groove 12.

In some embodiments, referring to FIGS. 1 to 4, the method for manufacturing the display device according to the embodiment of the present disclosure further includes: slotting at a set position on the cover plate 8 to form a first groove 11; an opening of the first groove 11 being proximal to the surface of the monolayer region 201, and the signal emitter 4 being located in the first groove 11.

Similar to the step of disposing the signal emitter 4 on the emitter driver circuit 401 as shown in FIGS. 6(a) to 6(d), the steps of disposing the signal receiver 5 on the monolayer region 201 and disposing the signal processor 6 on the flexible circuit board 3 may also be performed by the laser spot welding in combination with the silver paste, and both the electrode of the sensor driving circuit and the electrode of the flexible circuit board 3 may be Cu/Au electrodes as described above, which will not be repeated here.

The above description is only exemplary embodiments of the present disclosure, but the present disclosure is not limited thereto, and various changes or substitutions can be conceived easily by one of ordinary skill in the art are within the scope of the present disclosure. The scope of the present disclosure should be defined by the appended claims and their equivalents.

What is claimed is:

1. A display panel, comprising
   a first substrate and a second substrate, wherein a length of the second substrate is greater than that of the first substrate in at least one direction, a portion of the second substrate beyond the first substrate in a case that the first substrate and the second substrate are assembled into a cell forms a monolayer region, and
   a signal receiver disposed on the monolayer region for receiving a detection signal from external environment.

2. The display panel of claim 1, further comprising a signal emitter, wherein the signal emitter is disposed on the monolayer region for emitting a signal to the external environment, and the signal emitter and the signal receiver are disposed to form an angle therebetween.

3. The display panel of claim 2, wherein
   the signal emitter is an infrared light emitter, and comprises an emitter driving circuit arranged on the monolayer region and an infrared light emitting diode disposed on and electrically connected with the emitter driving circuit, an output terminal of the emitter driving circuit is provided with a first bonding electrode, and
a light emitting surface of the infrared light emitting diode is provided with a collimating lens thereon.

4. The display panel of claim 3, wherein
the signal receiver is an infrared light sensor, and comprises a sensor driving circuit disposed on the monolayer region and an infrared light sensing component disposed on and electrically connected with the sensor driving circuit, and
an output terminal of the sensor driving circuit is provided with a second bonding electrode.

5. The display panel of claim 3, wherein the infrared light emitting diode has a thickness of 0.2 mm to 0.5 mm, and the collimating lens has a thickness of 0.2 mm to 0.5 mm.

6. The display panel of claim 2, wherein the signal emitter and the signal receiver are separated from each other by a certain distance.

7. A display assembly comprising the display panel of claim 1, and further comprising:
a flexible circuit board bonded to a side of the monolayer region of the display panel; and
a signal processor disposed on the flexible circuit board,
wherein the signal receiver is electrically connected with the signal processor through the flexible circuit board, and the signal processor is configured to process the detection signal received by the signal receiver.

8. The display assembly of claim 7, wherein a signal emitter is further provided on the monolayer region for emitting a signal to the external environment, and the signal emitter and the signal receiver are disposed to form an angle therebetween,
wherein the signal emitter is electrically connected with the signal processor through the flexible circuit board.

9. The display assembly of claim 8, wherein the signal emitter comprises a first bonding electrode, the signal receiver comprises a second bonding electrode, and the first bonding electrode and the second bonding electrode are respectively bonded to the flexible circuit board.

10. The display assembly of claim 8, wherein a connection line connecting the signal emitter, the signal receiver and the signal processor has a triangle shape.

11. A display device, comprising the display assembly of claim 7.

12. The display device of claim 11, further comprising a cover plate disposed on a side of the display panel, a side of the cover plate proximal to the monolayer region being provided with a groove for receiving the signal receiver.

13. The display device of claim 12, wherein a signal emitter is further disposed on the monolayer region of the display panel for emitting a signal to the external environment, the signal emitter and the signal receiver are disposed to form an angle therebetween, and a groove is further disposed on the side of the cover plate proximal to the monolayer region for receiving the signal emitter.

14. The display device of claim 13, wherein a collimating lens is disposed on the signal emitter, a distance between the collimating lens and a concave surface of the groove for receiving the signal emitter is 0 mm to 0.064 mm, and a thickness of a portion of the cover plate where the groove for receiving the signal emitter is located is 0.3 mm to 0.7 mm.

15. A method for manufacturing a display assembly, comprising:
providing a display panel, wherein the display panel comprises a first substrate and a second substrate, a length of the second substrate is greater than that of the first substrate in at least one direction, a portion of the second substrate beyond the first substrate after the first substrate and the second substrate are assembled into a cell forms a monolayer region, and a bonding electrode is disposed on the monolayer region;
disposing a signal receiver on the monolayer region and electrically connecting the signal receiver to the bonding electrode;
disposing a signal processor on a flexible circuit board; and
electrically connecting the flexible circuit board disposed with the signal processor to the bonding electrode.

16. The method of claim 15, further comprising: disposing a signal emitter on the monolayer region,
wherein the signal receiver is an infrared light sensor, the signal emitter is an infrared light emitter, and wherein
the disposing the signal emitter on the monolayer region comprises disposing an emitter drive circuit on the monolayer region and disposing an infrared light emitting diode on the emitter drive circuit.

17. The method of claim 16, wherein the disposing the infrared light emitting diode on the emitter driving circuit comprises:
dispensing silver paste on the emitter driving circuit;
curing the silver paste;
placing the infrared light emitting diode on the silver paste, and welding tin around the infrared light emitting diode; and
coating an ultraviolet light curable adhesive around the infrared light emitting diode to cover a tin layer.

18. The method of claim 17, wherein the curing the silver paste comprises curing the silver paste by laser.

19. The display panel of claim 3, wherein the signal emitter and the signal receiver are separated from each other by a certain distance.

20. The display panel of claim 4, wherein the signal emitter and the signal receiver are separated from each other by a certain distance.

* * * * *